United States Patent [19]
Te Velde et al.

[11] Patent Number: 4,681,403
[45] Date of Patent: Jul. 21, 1987

[54] DISPLAY DEVICE WITH MICROMECHANICAL LEAF SPRING SWITCHES

[75] Inventors: Ties S. Te Velde; Joannes L. M. Van de Venne, both of Eindhoven, Netherlands

[73] Assignee: U.S. Philips Corporation, New York, N.Y.

[21] Appl. No.: 877,696

[22] Filed: Jun. 19, 1986

Related U.S. Application Data

[63] Continuation of Ser. No. 396,534, Jul. 8, 1982, abandoned.

[30] Foreign Application Priority Data

Jul. 16, 1981 [NL] Netherlands ............ 8103377

[51] Int. Cl.⁴ .................... G02F 1/01; G02F 1/133
[52] U.S. Cl. .................... 350/334; 350/356; 350/357
[58] Field of Search ............ 350/334, 486, 487, 355, 350/356, 357; 307/112, 115, 117; 200/181, 283; 335/187; 361/207

[56] References Cited

U.S. PATENT DOCUMENTS

| Re. 31,498 | 1/1984 | Te Velde | 350/269 |
| 3,950,077 | 4/1976 | Jansinski | 350/357 |
| 4,099,839 | 7/1978 | Giglia | 350/357 |
| 4,104,727 | 8/1978 | Washizuko et al. | 350/334 X |
| 4,403,248 | 9/1983 | Te Velde | 358/62 |
| 4,413,883 | 11/1983 | Boraff et al. | 350/334 |
| 4,426,643 | 1/1984 | Martin | 350/357 |
| 4,431,271 | 2/1984 | Okubo | 350/334 |
| 4,523,811 | 6/1985 | Ota | 350/339 R |

OTHER PUBLICATIONS

Nathanson et al. "The Resonant Gate Transistor", IEEE Transactions on Electron Devices, vol. ED-14, No. 3, Mar. 1967, p. 117.
Frobenius et al. "Microminiature Ganged Threshold Accelerometers Compatible with Integrated Circuit Technology", IEEE Trans. on Elec. Devices, vol. ED-19, No. 1, Jan. 1972, p. 37.
Kuhn et al. "Simple Matrix Addressing Structure for Large Area Liquid Crystal Display Devices", IBM Technical Disclosure Bulletin, vol. 16, No. 10, Mar. 1974, pp. 3402-3404.
Petersen "Micromechanical Membrane Switches on Silicon", IBM J. Res. & Develop., vol. 23, No. 4, Jul. 1979, pp. 376-385.
Castleberry I "Varistor Controlled Multiplexed Liquid Crystal Display", 1978 Biennial Display Research Conference, Oct. 1978, pp. 42-43.
Castleberry II "Control Layers for Liquid Crystal Matrix Displays", 1980 Biennial Display Research Conference, pp. 89-92, Oct. 1980.

Primary Examiner—John K. Corbin
Assistant Examiner—David Lewis
Attorney, Agent, or Firm—Paul R. Miller

[57] ABSTRACT

A layer of liquid crystal is present between two supporting plates with a large number of picture electrodes arranged in rows and columns on at least one of the supporting plates. Strip-shaped row electrodes and strip-shaped column electrodes are provided between the respective rows and columns of the picture electrodes. The picture electrodes arranged in rows can be contacted with a respective row electrode by way of at least one micromechanical leaf spring which provides the liquid crystal with a sufficiently steep threshold with respect to the applied voltage, and provides the liquid crystal with a memory when the picture electrodes form picture elements of a display device. Because of this arrangement, the number of lines to be driven of the display device can be extended.

35 Claims, 27 Drawing Figures

DISPLAY DEVICE WITH MICROMECHANICAL LEAF SPRING SWITCHES

This is a continuation of application Ser. No. 396,534, filed July 8, 1982 now abandoned.

The invention relates to a display device comprising an electro-optical display medium between two supporting plates which are provided with a system of picture elements arranged in rows and columns and a system of row and column electrodes for driving the system of picture elements, in which each picture element can be connected to an electrode of the system of row and column electrodes by means of a switching element.

Such a display device is suitable for displaying alphanumerical information and video information by means of passive electro-optical display media, for example, liquid crystals, electrophoretic suspensions and electrochromic materials.

The known passive electro-optical display media generally have an insufficiently steep threshold with respect to the applied voltage and/or have an insufficient intrinsic memory. These properties are the cause that in matrix display devices the number of lines to be driven is low. Due to the lack of memory, the information presented to a selected row electrode via the column electrode must be written again and again. Moreover, the voltages presented to the column electrodes are present not only across the picture elements of a selected row electrode, but also across the picture elements of all other row electrodes. As a result of this, picture elements, during the time they are not driven, experience an effective voltage which may be sufficient to bring a picture element to the on-state. Furthermore, when the number of row electrodes increases, the ratio of the effective voltage which a picture element experiences in the on- and off-state decreases. Due to the lack of a sufficiently steep threshold, the contrast between picture elements in the on- and off-state thereby decreases.

It is known that the number of rows to be driven can be increased by integrating an extra switch per picture element. This switch ensures a sufficient threshold with respect to the applied voltage and ensures that the information presented to a driven row electrode remains across a picture element during the time that the remaining row electrodes are driven. The switch also prevents a picture element from experiencing an effective voltage during the time that it is not driven.

A display device of a kind mentioned in the opening paragraph is known from the article "Active Matrix Addressing Techniques", S.I.D. Seminar Lecture Notes, May, 1980, pp. 1–34. As switching elements are mentioned in this article non-linear resistors, such as varistors; metal oxide semiconductor (MOS) structures and thin-film transistors.

These known switching elements have the disadvantage that the threshold voltage of the switching elements and the voltage drop across the series resistor of the switching element have always to be added to the threshold voltage of the electro-optical effect.

Furthermore, these switching elements have a comparatively large capacitance with respect to the capacitance of a display element. Upon driving, a voltage division occurs between these capacitances as a result of which only a part of the presented voltage comes across a display element. A further disadvantage of active switching elements is that the resistance of the switching element in the off-state often is not large enough to prevent leakage currents. As a result of this, the achievable memory time of the display device is restricted.

The known switching elements furthermore occupy a comparatively large area with respect to the area of the display elements.

It is therefore the object of the invention to provide a display device having better suited switching elements. For that purpose, a display device of a kind mentioned in the opening paragraph is characterized in that each switching element is formed by at least one electrostatically controllable micromechanical leaf spring. These micromechanical leaf springs are switched by applying a voltage difference between the micromechanical leaf springs and the electrodes to be contacted. The micromechanical leaf springs are bistable, which means that the micromechanical leaf springs flip to the electrodes to be contacted only above a given threshold voltage. Such very small micromechanical leaf springs can be manufactured by means of known vapour deposition and undercutting methods. Such methods are described in Netherlands Patent Application No. 7510103 (corresponding to U.S. Pat. No. 4,178,077) and in the non-prepublished Netherlands Patent Applications 8001281 and 8002635 (corresponding to U.S. patent application Ser. No. 601,894, now U.S. Pat. No. 4,528,583 and U.S. patent application Ser. No. 595,773 now abandoned).

An advantage of these micromechanical leaf springs as switching elements is that in the closed condition the threshold voltage of the switching element disappears. Moreover, because a purely metal-to-metal contact is made, the series resistance of the switching element in the closed condition is negligibly small. As a result of this, the voltage drop across the switching element need no longer be added to the threshold voltage of the electro-optical effect. As a result of this, the voltages required for driving the display device can be obtained with conventional integrated circuits.

A further advantage of these micromechanical leaf springs is that the resistance of the switching element in the open condition is infinitely large. In fact, in the non-energized condition a micromechanical leaf spring is spaced apart from the electrode to be contacted. As a result of this, the voltage across a display element cannot leak away via the switch, so that the memory time of the display device is considerably extended.

A further advantage of the micro mechanical leaf springs as switching elements is that the switching elements have a negligible capacitance with respect to the capacitance of the display elements. As a result of this substantially the entire driving voltage comes across a display element.

Furthermore, the micro mechanical leaf springs occupy only a small area as compared with the area of the display elements, so that the switching elements are substantially unnoticeable. Moreover, the micro mechanical leaf springs permit a large freedom in design and the micro mechanical leaf springs can be realized in a variety of manners.

It is to be noted that micro switching elements are known per se from the article "Micromechanical Membrane Switches on Silicon" I.B.M. J.Res Develop. 23, 4, 1979, 376–385. The switching elements are formed by metallized $SiO_2$ membranes which are provided in a silicon substrate by means of IC-techniques. The membranes can bend under the influence of a voltage difference and hence contact another electrode. In this case, however it does not relate to switching elements for a display device having an electro-optical display medium which give the electro-optical display medium a threshold and a memory.

A first embodiment of a display device according to the invention is characterized in that each picture element is formed by two picture electrodes respectively provided on the facing surfaces of the supporting plates, the row electrodes are provided on one supporting plate and the column electrodes are provided on the other supporting plate, and each picture electrode on one supporting plate can be connected to a row electrode by means of at least one micromechanical leaf spring. In this embodiment a micromechanical leaf spring is connected in series with a display element between a row electrode and a column electrode. This embodiment is the analog of an ideal non-linear resistor. It is to be noted that both the row electrodes and the column electrodes may serve as driving electrodes and information electrodes.

A second embodiment is characterized in that the row electrodes extend below the picture electrodes and are electrically insulated from the picture electrodes, the picture electrodes have an aperture extending over a row electrode which is not insulated at the area of the aperture, and each picture electrode can be connected to a row electrode by means of at least one micromechanical leaf spring provided at the area of the aperture in the picture electrode, the leaf spring being enclosed in a cavity which is formed by an electrically conductive covering hood extending over the aperture in a picture electrode. In this embodiment the micro-switch does not move freely in the display medium but is covered by a covering hood. When a liquid crystal is used as a display medium, this embodiment presents the advantage that the orientation layer for the liquid crystal molecules at the area of the switch need not be interrupted but may continue over the covering hood. Thus the occurrence of possible interfering regions at the area of the switches is prevented.

A further embodiment is characterized in that the picture electrodes and the covering hood are reflective.

In the first and second embodiments the picture electrodes and the column electrodes on the other supporting plate may advantageously be integrated to strip-shaped electrodes.

A third embodiment is characterized in that the row electrodes and the column electrodes are provided on one supporting plate, the system of picture elements is formed by picture electrodes provided on the one supporting plate and a common counter electrode provided on the other supporting plate, and in that a picture electrode can be connected to an associated column electrode by means of at least one micromechanical leaf spring which can be switched by the associated row electrode. This embodiment is the analog of an ideal TFT switch. The row and column electrodes are present on the same supporting plate. A picture electrode and a column electrode are contacted by a micromechanical leaf spring which is switched by a row electrode.

A fourth embodiment is characterized in that at each crossing a column electrode is insulated from a row electrode by means of an electrically conductive bridge, in that a micromechanical leaf spring extends below the bridge over the row electrode and a part of the associated picture electrode, and in that at least one end of the micromechanical leaf spring is connected to a column electrode. In this embodiment a picture electrode and a column electrode are contacted by a micromechanical leaf spring which is incorporated in the column electrode. The micromechanical leaf spring which again is switched by a row electrode itself conducts current.

A fifth embodiment is characterized in that the micromechanical leaf spring also forms the electrically conductive bridge. The micromechanical leaf spring forms a part of the column electrode.

A sixth embodiment is characterized in that the part of the picture electrode below the micromechanical leaf spring is provided on the row electrode, the picture electrode and the row electrode being electrically insulated from each other by an insulating layer. In this embodiment a comparatively large area of the row electrode is present below the micromechanical leaf spring to form the electric field for flipping over the micromechanical leaf spring towards the picture electrode.

A seventh embodiment is characterized in that the column electrodes and the row electrodes are insulated from each other at the crossings, in that the fixed ends of the micromechanical leaf springs are provided on one supporting plate and in that each micromechanical leaf spring extends over a row electrode and a part of a column electrode and a part of an associated picture electrode. The micromechanical leaf springs in this embodiment themselves do not convey current. Each micromechanical leaf spring is switched by a row electrode and in the switched condition contacts a column electrode and a picture electrode.

In order to increase the reliability, the picture elements in a display device in accordance with the invention may be provided with several micromechanical leaf springs in series, parallel or a combination thereof.

Embodiments of the invention will now be described, by way of example, with reference to the accompanying drawings, in which.

Figure 2:
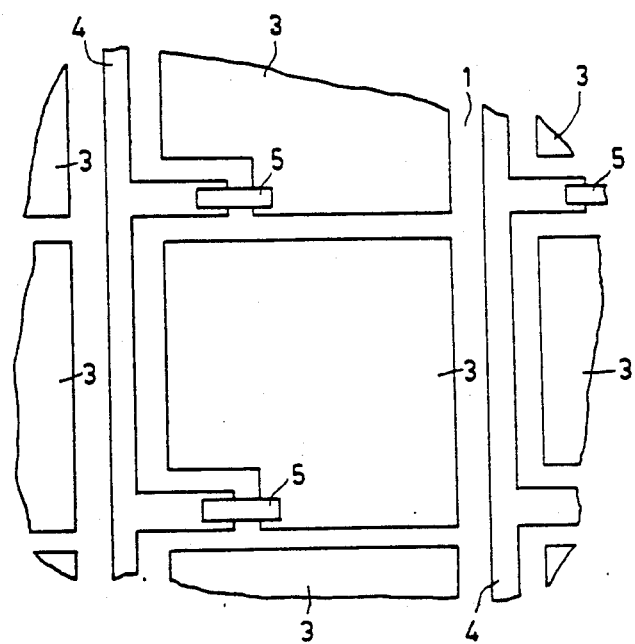
FIG. 2 is a plan view of a part of the inner surface of one of the supporting plates shown in FIG. 1.
Figure 4:
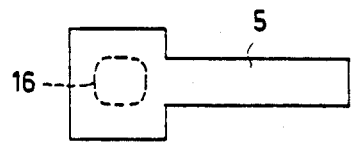
Figure 5:
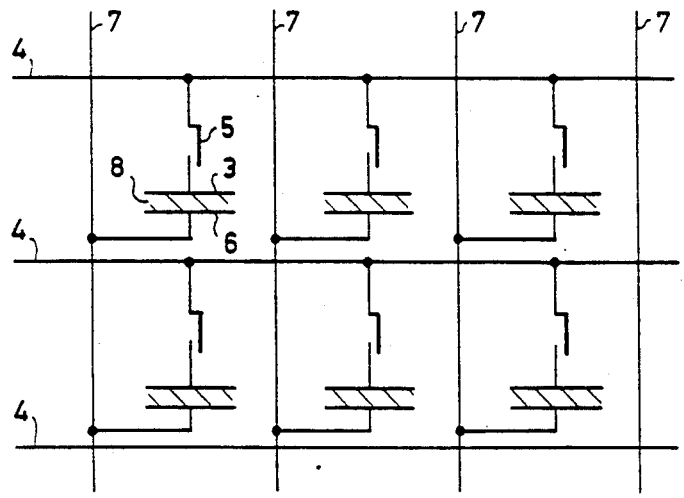
Figure 6A:
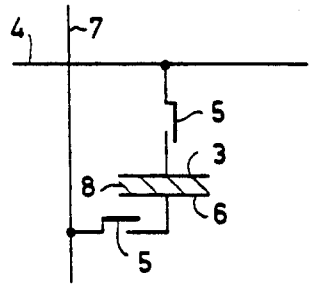
Figure 6B:
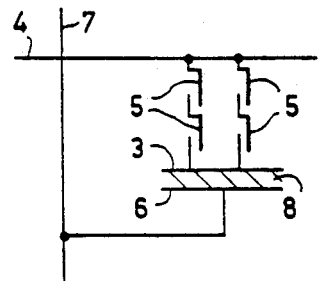
Figure 7A:
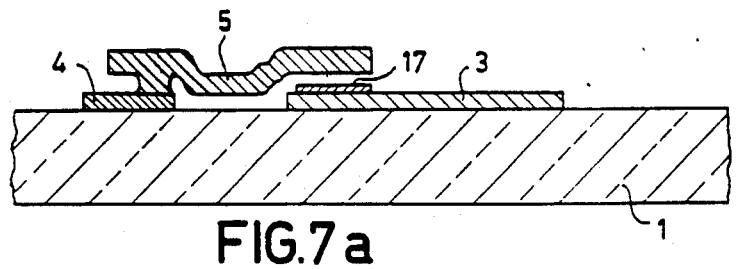
Figure 7B:
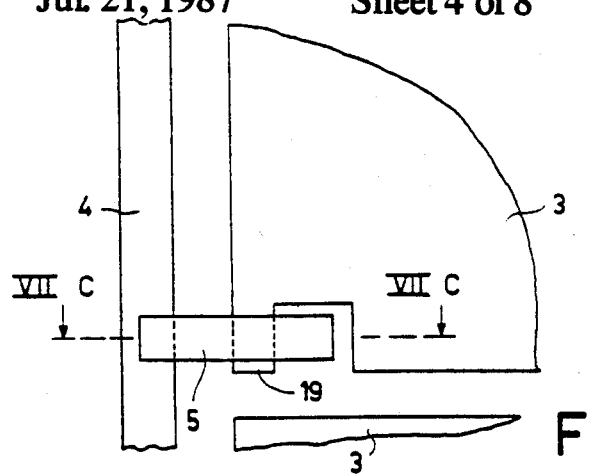
Figure 7C:
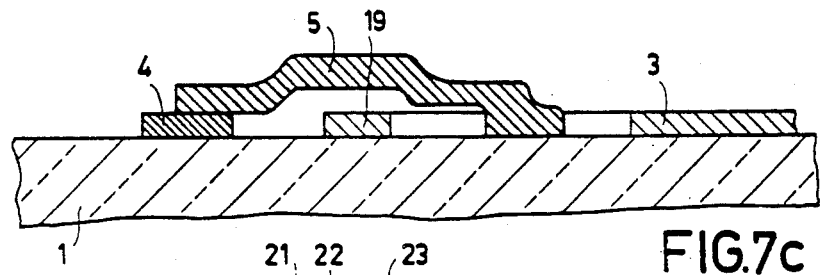
Figure 8:
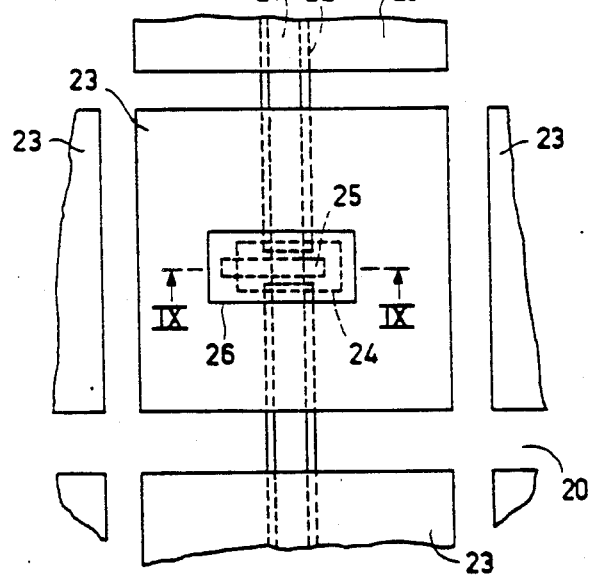
Figure 9:
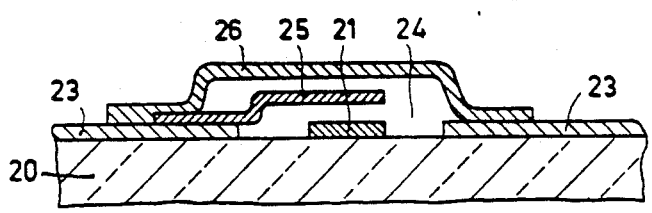
Figure 11:
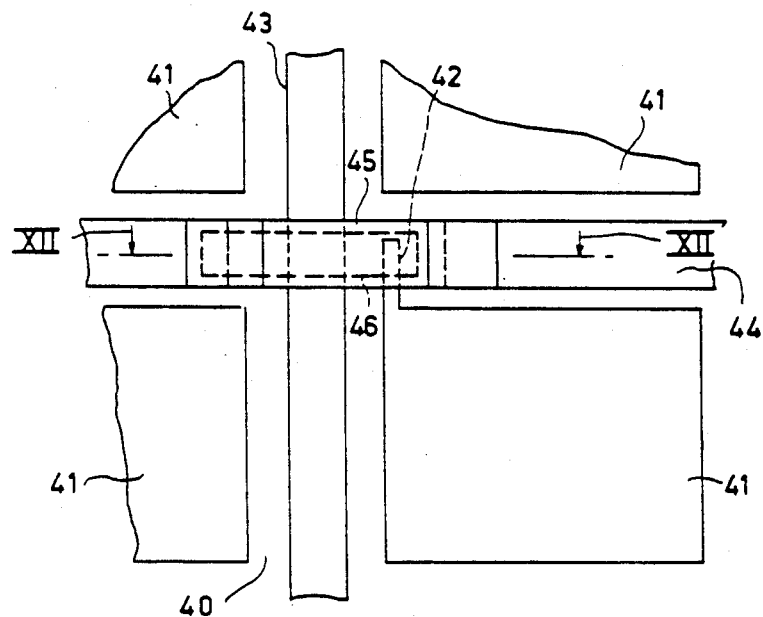
Figure 12:
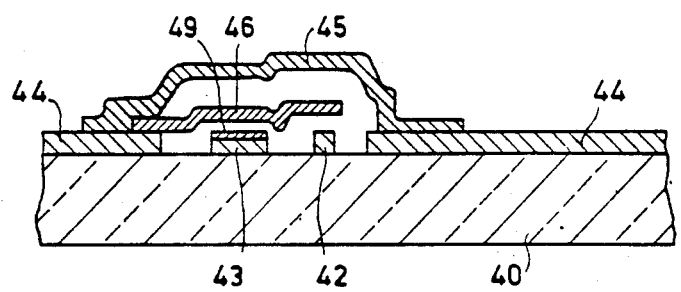
Figure 13:
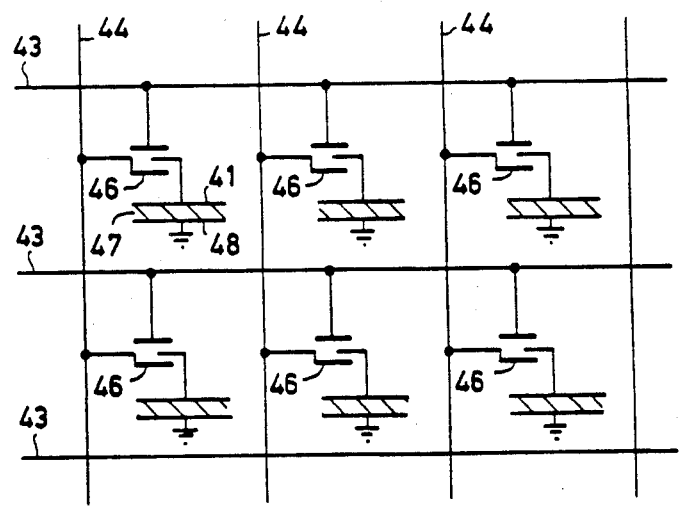

FIGS. 3a to 3d explain a first method of manufacturing the system shown in FIG. 2;

FIG. 4 explains a second method of manufacturing the system shown in FIG. 2;

FIG. 5 is a diagrammatic representation of the first embodiment;

FIGS. 6a and 6b show diagrammatically the first embodiment having several switching elements per picture element;

FIG. 7a shows a first modification of the first embodiment;

FIGS. 7b and 7c show a second modification of the first embodiment;

FIG. 8 is a plan view of a part of a supporting plate of a second embodiment;

FIG. 9 is a sectional view taken on the line IX—IX of FIG. 8;

FIGS. 10a to d explain a method of manufacturing the system shown in FIG. 9;

FIG. 11 is a plan view of a part of a supporting plate of a third embodiment;

FIG. 12 is a sectional view taken on the line XII—XII of FIG. 11;

FIG. 13 is a diagrammatic representation of the third embodiment; and

Figure 14A:
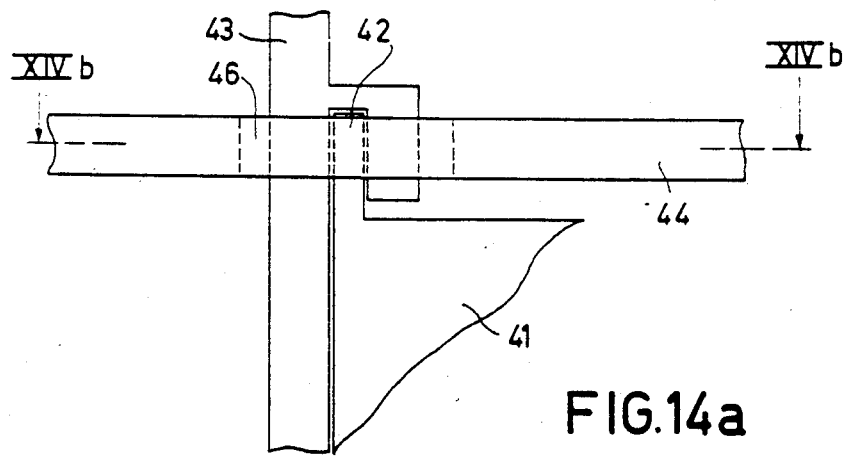
Figure 14B:
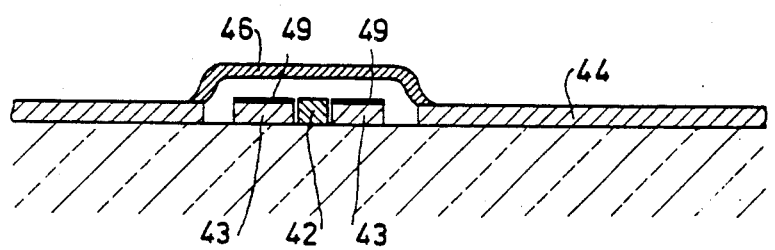
Figure 15A:
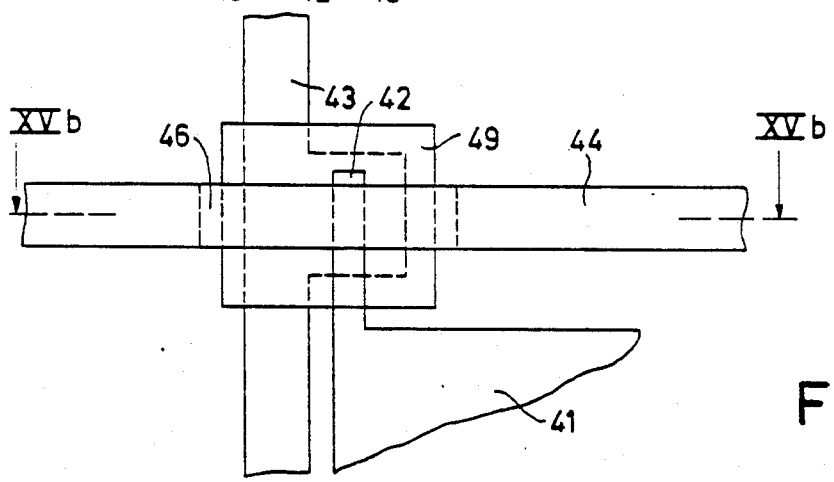
Figure 15B:
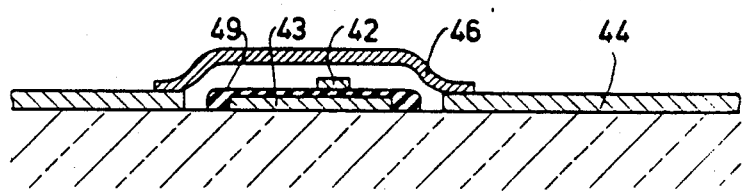

FIG. 14a is a plan view of a part of a supporting plate of a first modified embodiment of the third embodiment, FIG. 14b is a sectional view taken on the line XIVb—XIVb in FIG. 14a, FIG. 15a is a plan view of a part of a supporting plate of a second modified embodiment of the third embodiment, FIG. 15b is a sectional view taken on the line XVb—XVb of FIG. 15a.

Figure 16:
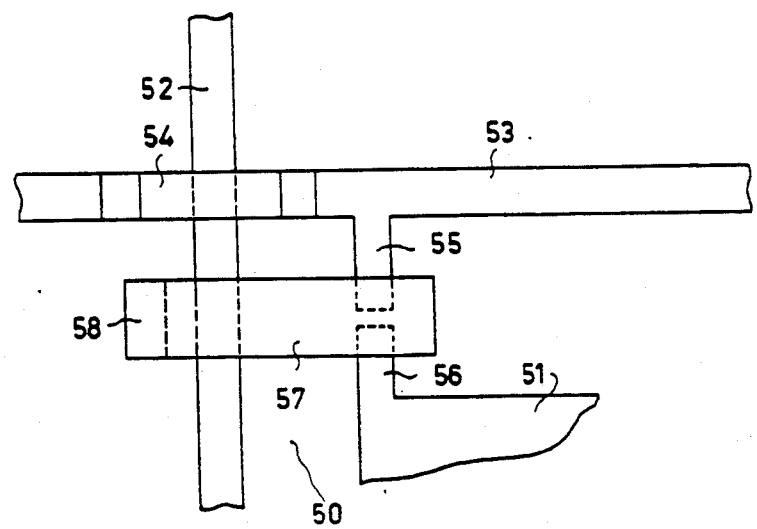

FIG. 16 is a plan view of a part of a supporting plate of a fourth embodiment.

Figure 1:
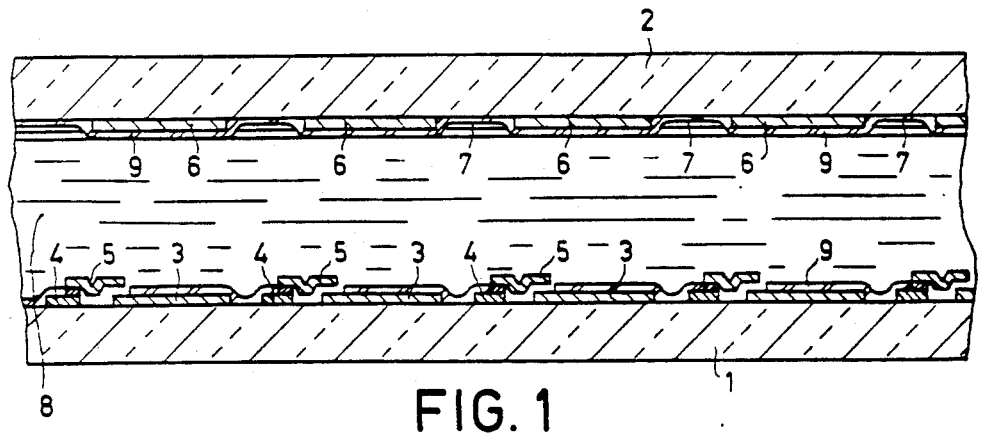
FIG. 1 is a sectional view of a first embodiment.

FIG. 1 is a diagrammatic sectional view of a part of a first embodiment of a liquid crystal display device according to the invention. The display device comprises two transparent glass supporting plates 1 and 2 which are at a distance of 10 /μm from each other. The supporting plates may also be manufactured from a ceramic or another material. A large number of picture electrodes 3 arranged in rows and columns are provided on the supporting plate 1. Transparent strip-shaped row electrodes, so-called scan electrodes 4, are provided between the rows of picture electrodes 3. Each picture electrode 3 can be contacted with a scan electrode 4 by means of a micromechanical leaf spring 5. A large number of picture electrodes 6 arranged in rows and columns are also provided on the supporting plate 2. Transparent strip-shaped column electrodes, so-called data electrodes 7, are provided between the picture electrodes 6 and the picture electrodes 6 are conductively connected to the data electrodes 7. The picture electrodes 6 with the picture electrodes 3 on the supporting plate 1 form the display elements of the display device. It is to be noted that the data electrodes 7 and the picture electrodes 6 may advantageously be integrated to strip-shaped electrodes. This makes the alignment of the supporting plates relative to each other simpler. A liquid crystal 8 is present between the supporting plates 1 and 2. The display device is suitable for use with all known electro-optical effects based on liquid crystals, such as the twisted-nematic field effect, the cholesteric-nematic phase transition and the so-called guest-host effect. Liquid crystal orienting layers 9 are provided on the surface of the supporting plate 1 except at the area of the micromechanical leaf springs 5 and on the surface of the supporting plate 2. FIG. 2 is a diagrammatic plan view of a part of the inner surface of the supporting plate 1. The picture electrodes 3 arranged in rows and columns are substantially rectangular and have an area of approximately $250 \times 250$ $\mu m^2$. The scan electrode 4, having a width of approximately 25 μm, extend between the rows of picture elements 3. The picture electrodes 3 and the scan electrodes 4 are manufactured from tin oxide and/or indium oxide. Each picture electrode can be connected to a scan electrode 4 by means of a micromechanical leaf spring 5 having a fixed end connected to the scan electrode 4. The dimensions of the micromechanical leaf springs 5 are approximately $10 \times 20$ $\mu m^2$. The micromechanical leaf springs 5 occupy only a very small area as compared with the area of the picture electrodes 3.

Figure 3A:
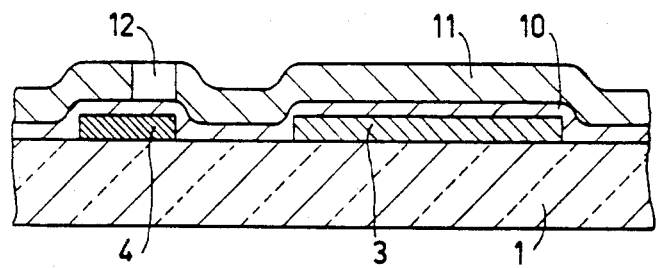
Figure 3B:
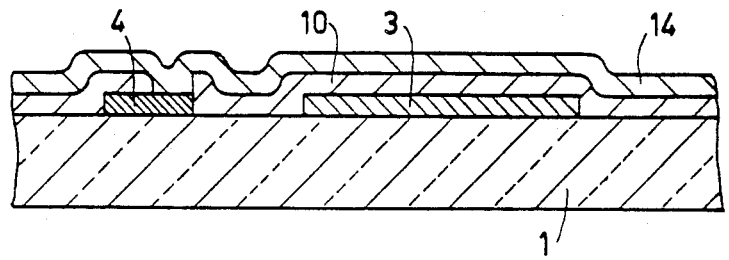
Figure 3C:
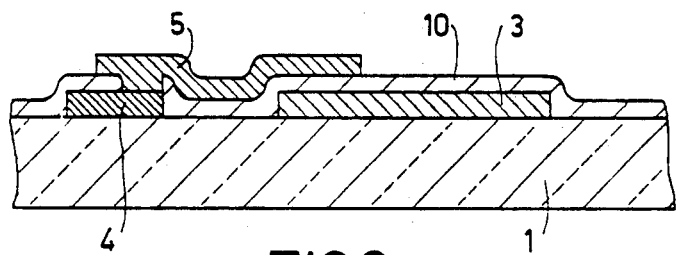
Figure 3D:
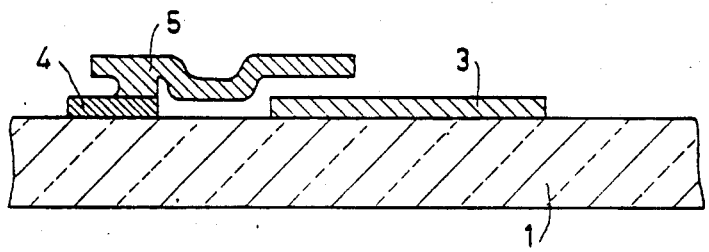

The manufacture of such micromechanical leaf springs 5 will be explained with reference to FIGS. 3a to 3c. FIG. 3a shows the glass supporting plate 1 on which the picture electrodes 3 and the scan electrodes 4 with a thickness of 0.01 to 0.02 μm are provided in known manner. An aluminim layer 10, which is 0.3 μm thick, is provided thereon. A layer 11 of photolacquer is then provided on the aluminium layer 10. Apertures 12 are provided in the layer 11 in known manner. These apertures 12 corresponds to the ends of the micromechanical leaf springs which should remain fixed to the scan electrodes 4. The aluminium layer 10 at the area of the apertures 12 is then etched away, after which the layer 11 is again removed. A layer of nickel 14, which is 0.15 μm thick, is then provided on the aluminium layer (see FIG. 3b). The nickel is provided by electroplating the layer from a nickel sulphamate bath. As a result of this a nickel layer is obtained which engages the aluminium layer 10 substantially without mechanical stress. The pattern of the micromechanical leaf springs 5 is then etched in the nickel layer 14 by means of a photo etching method (see FIG. 3c). The etchant is diluted nitric acid at approximately 40° C. which does not attack the aluminium layer 10. Etching with a 1% solution of sodium hydroxide which does not attack the nickel leaf springs 5 but does attack the aluminium layer 10 is then carried out. The aluminium layer 10 is removed by undercutting via the edges of the micromechanical leaf spring 5, after which the construction shown in FIG. 3d is obtained A second method will be described with reference to FIG. 4. First again an aluminium layer is provided on the supporting plate and then a nickel layer is provided. The micromechanical leaf springs 5 are then etched in the nickel layer to a shape as shown in FIG. 4. The part of the micromechanical leaf springs 5 which is to remain connected to the scan electrodes 4, is wider than the remainder of the micromechanical leaf springs 5. The aluminium is then removed by undercutting via the edges of the micromechanical leaf springs 5. Etching is discontinued when the aluminium has been removed below the narrow part of the micromechanical leaf springs. An aluminium pillar remains below the wide part of each micromechanical leaf spring 5, which is denoted in FIG. 4 by the broken line 16.

In the above-described manners it is possible in a simple technique to manufacture micromechanical leaf springs for switching elements in liquid crystal display devices. The switching elements give the liquid crystal display device a sufficiently steep threshold with respect to the applied voltage and a memory.

The operation of the display device shown in FIG. 1 will be explained with reference to FIG. 5 which is a diagrammatic representation of the display device.

The picture elements are connected between the scan electrodes 4 and the data electrodes 7, in which a switching element having a micromechanical leaf spring 5 is connected in series with each picture element. Upon writing the display device, the scan electrodes 4 are successively driven with voltage pulses $+V_s$. During the time a scan electrode 4 is driven, voltage pulses $-V_d$ are applied to selected data electrodes 7. A voltage difference $V_s+V_d$ then is across the selected data electrodes 7 and the associated scan electrode 4. This voltage difference also is across the series arrangement of the capacitor of a picture element and the capacitor of a switching element. A voltage division occurs across the capacitors. However, the capacitance of the switching elements with micromechanical leaf springs 5 is very much smaller than the capacitance of the picture elements, so that substantially the entire voltage difference $V_s+V_d$ comes across the switching elements. The voltage $V_s+V_d$ is larger than the threshold voltage $V_{th}$ of the switching elements. As a result of the occurring electrostatic forces the micromechanical leaf springs 5 are attracted toward the picture electrodes 3. After a switching element is closed, the full voltage $V_s+V_d$ comes across a picture element. The voltage drop across a switching element itself is negligibly small because the contact between a micromechanical leaf spring 5 and a picture electrode 3 is a pure metal-to-metal contact. The voltage $V_s+V_d$ across a driven picture element brings the liquid crystal into a different orientation condition and hence in an optically different condition. Voltage pulses $+V_d$ are applied to the non-selected data-electrodes 7. A voltage difference $V_s-V_d$ then prevails across the data electrodes 7 and the scan electrode 4. This voltage difference $V_s-V_d$ is smaller than the threshold voltage $V_{th}$ of the switching elements, so that these are not energized. The voltage pulses $\pm V_d$ also come across the switching elements of the non-driven scan electrodes 4. However, the voltage pulses $\pm V_d$ are smaller than the threshold voltage $V_{th}$ of the switching elements. As a result of this it is also prevented that information is written in picture elements of non-driven scan electrodes 4.

After writing the information on a driven scan electrode 4, the micromechanical leaf spring springs back again so that the resistance of the switching elements is infinitely large. As a result of this the voltage across a picture element cannot leak away via the switching element so that the memory time of the written information is very long.

For the embodiment shown with micromechanical leaf springs of $10\times20$ μm, picture electrodes of $250\times250$ μm, and a spacing between the micromechanical leaf springs and the picture electrode to be contacted of 0.3 μm, the threshold voltage of the switching elements is approximately $V_{th}=10$ V.

In order to increase the reliability of the display device, the picture elements may comprise several switching elements connected in series and/or in parallel. In FIG. 6a two switching elements are placed in series with the picture element. In case one of the switching elements fails as a result of the occurrence of welding points between the micromechanical leaf spring and the electrode to be connected, the switching function is taken over by the other switching element. In FIG. 6b two series-arranged switching elements are placed in parallel with the picture element. If one of the switching elements in one of the two parallel branches fails, the switching function is taken over by the other branch.

FIG. 7a shows an embodiment in which an extra contact point 17 is provided on the picture electrode 3 to be contacted for obtaining a good metal-to-metal contact if the resistance of the contact provides to be not small enough.

A modified embodiment of the first embodiment will be explained with reference to FIGS. 7b and 7c. FIG. 7b is a diagrammatic plan view of a part of the supporting plate 1. The micromechanical leaf spring is connected with its one end on the scan electrode 4 and with its other end to the supporting plate 1. A part 19 of the picture electrode 3 extends below the micromechanical leaf spring 5. For further explanation, FIG. 7c is a cross-sectional view taken on the line VIIc—VIIc in FIG. 7b. Upon energization of the switching element, the central portion of the micromechanical leaf spring 5 between the two fixed ends flips over to the part 19 of the picture electrode 3.

A second embodiment of a display device in accordance with the invention will be explained with reference to FIG. 8 which is a diagrammatic plan view of a part of the supporting plate 20. Otherwise, the construction of the display device is the same as that of the display device shown in FIG. 1. The scan electrodes 21 have an insulating layer 22. Reflecting picture electrodes 23 are provided over the scan electrodes 21. At the area of the scan electrodes 21 the pocture electrodes 23 have an aperture 24. The insulation layer over the scan electrodes 21 is interrupted in the aperture 24. The fixed end of a micromechanical leaf spring 25 is provided on the picture electrode 23 and extends in the aperture 24 to over the scan electrode 21. The micromechanical leaf spring 25 is enclosed in a cavity which is formed by the surface of the supporting plate 20 and a covering hood 26 provided over the aperture 24.

FIG. 9 is a diagrammatic sectional view taken on the line IX—IX in FIG. 8. An advantage of this embodiment is that the layer provided on the supporting plate for orienting the liquid crystal molecules can also be provided on the covering hood 26. Thus the occurrence of possible interfering regions by the lack of an orienting layer at the area of the switching elements is prevented. A further advantage is that the switch does not move in the liquid crystal but in air. The driving of the display device is carried out in the same manner as described with reference to FIG. 5.

As in the embodiment shown in FIGS. 7b and 7c, the micromechanical leaf spring 25 may be connected rigidly to the picture electrode 23 at both ends.

A method of manufacturing such a display device will be explained with reference to FIGS. 10a to 10d.

Figure 10A:
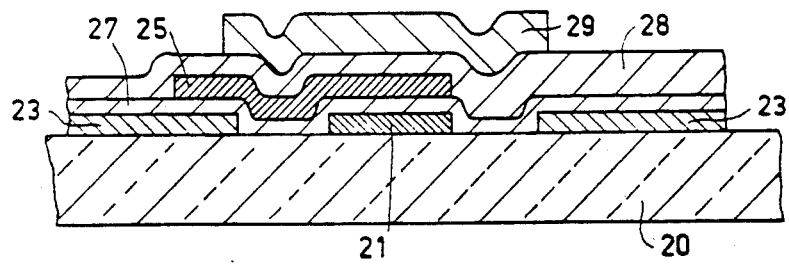
Figure 10B:
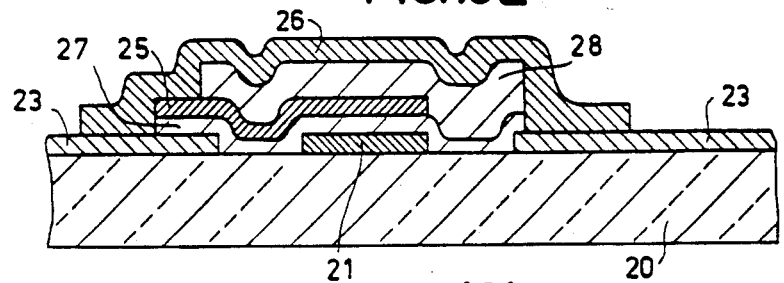

The scan electrodes 21 and the reflecting picture electrodes 23 are provided in known manner on the supporting plate 20. The assembly is then covered with a 0.3 μm thick layer 27 of aluminium. A strip of nickel having a thickness of 0.15 μm is then provided, in which the pattern of the micromechanical leaf spring 25 is etched by means of a nitric acid solution at 40° C. A layer 28 of aluminium is then provided to a thickness of 0.7 micrometers. Hereover a layer of photolacquer is provided in which masks 29 are provided photolithographically as shown in FIG. 10a. The length of mask 29 corresponds to the length of the aperture 24 in the picture electrodes 23 and the width of a mask 29 corresponds to the width of the covering hood 26 (see FIG. 8).

Figure 10C:
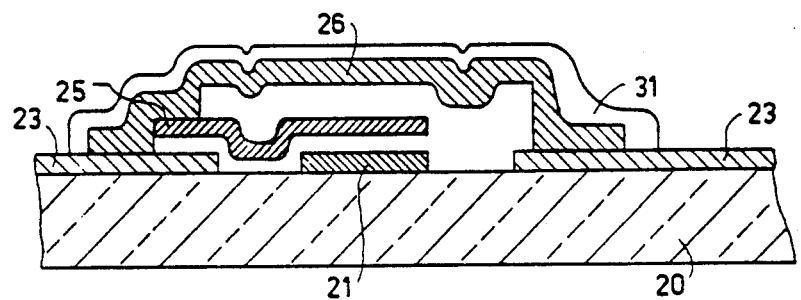
Figure 10D:
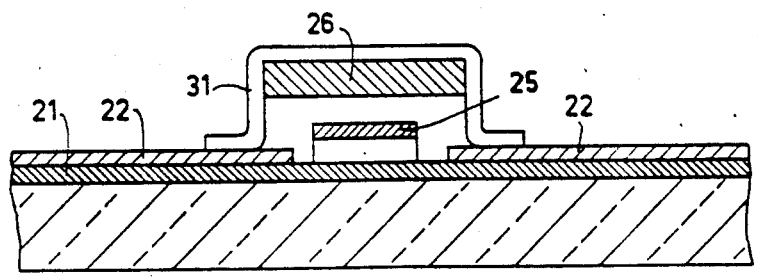

The aluminium of the layers 27 and 28 outside the mask 29 is then etched away by means of a sodium hydroxide solution of approximately 40° C. The assembly is then provided with a 1 μm thick nickel layer which is provided by electrodeposition. The pattern of the covering hood 26 is then etched in the nickel layer by means of a nitric acid solution at 40° C. (see FIG. 10b). The aluminium layers 27 and 28 below the covering hood 26 and below the micromechanical leaf spring 25 are then removed entirely by means of a sodium hydroxide solution at 40° C. A layer 31 of silicon oxide is then provided using the covering hood 26 as a mask (FIG. 10c). FIG. 10d is a cross-sectional view at right angles to the view of FIG. 10c. The micromechanical leaf spring is enclosed in a cavity formed by the supporting plate 20, the covering hood 26 and the layer 31.

A third embodiment of a display device in accordance with the invention will be explained with reference to FIG. 11 which is a plan view of a part of a supporting plate 40. Picture electrodes 41 arranged in rows and column are again provided on the supporting plate 40. Strip-shaped scan electrodes 43 extend between the rows of picture electrodes 41. Strip-shaped data electrodes 44 extend between the columns of picture electrodes. The data electrodes 44 are insulated from the scan electrodes 43 by means of conductive bridges 45. A part 42 of the associated picture electrode 41 is also present below each bridge 45. A micromechanical leaf spring 46 which with its fixed end is connected to a data electrode 44, extends below a bridge 45 over a scan electrode 43 and the part 42 of a picture electrode 41. An insulating layer 49 is provided below the bridge 45 on the scan electrode 43 so as to prevent shortcircuit.

FIG. 12 is a sectional view taken on the line XII—XII in FIG. 11. The manufacture of such crossing connections is carried out in substantially the same manner as described with reference to FIG. 10. The other supporting plate is provided with a counter electrode which is common to all picture electrodes 41.

The above-described embodiment is the analog of an ideal TFT switch. Since the scan electrodes and the data electrodes are present on the same supporting plate, the peripheral electronics can be connected in a simple manner.

The driving of this display device will be described with reference to FIG. 13 which is a diagrammatic representation of the display device. Writing information is carried out by successively driving the scan electrodes 43 with voltage pulses $V_s$. These voltage pulses $V_s$ are larger than the threshold $V_{th}$ of the switching elements. By electrostatic forces the micromechanical leaf springs 46 associated with a driven scan electrode 43 are attracted to the parts 42 of the picture electrodes 41 so that a conductive connection is produced between the data electrodes 44 and the associated picture electrodes 41 (see FIG. 12). Upon closing the switching elements, voltage pulses $V_d$ are applied to selected data electrodes 44 and come across the liquid crystal layer 47 between the picture electrodes 41 and the common counter electrode 48. Therefore the micromechanical leaf springs 46 convey current. A change in the orientation of the liquid crystal molecules takes place under the influence of voltage $V_d$, so that an optically different situation is obtained. After the information has been written on the picture elements of a driven scan electrode 43, the next scan electrode 43 is driven. As a result of this the switching elements associated with the previous driven scan electrode 43 are opened again so that the written information cannot leak away via the switching elements. As a result of this a very long memory time is obtained. This makes it possible to successively drive a very large number of lines and to provide them with information. In fact, a short memory time involves that the number of lines to be driven is restricted since the information has always to be written over and over again.

A first favourable modified embodiment of the third embodiment will be explained with reference to FIGS. 14a and 14b. FIG. 14a is a diagrammatic plan view of a part of the supporting plate 40 with picture electrode 41, scan electrode 43 and data electrode 44. A data electrode 44 is insulated from a scan electrode 43 by means of a micromechanical leaf spring 46 which is connected with its two ends to the data electrode 44. As a result of this the micromechanical leaf spring 46 also forms a conductive bridge. A part 42 of the picture electrode 41 is present below the micromechanical leaf spring 46. At the area of the micromechanical leafspring 46 the scan electrode 43 has a projecting part such that the part 42 of the picture electrode 41 is present between two equally large parts of the scan electrode 43. As a result of this, upon energizing the switch an electric field is formed over a large area, to attract the micromechanical leaf spring 46. FIG. 14b is a sectional view taken on the line VIVb—XIVb of FIG. 14a. An insulating layer 49 may again be provided below the mechanical leaf spring 46 so as to prevent shortcircuit. Writing information is carried out in the same manner as described with reference to FIG. 13. By driving a scan electrode 43, the micromechanical leaf spring 46 flips over to the part 42 of the picture electrode 41 so that a conductive connection is produced between the data electrode 44 and the picture electrode 41.

A second particularly favourable modified embodiment will be described in greater detail with reference to FIGS. 15a and 15b. FIG. 15a again is a diagrammatic plan view of a part of the supporting plate 40 with picture electrode 41, scan electrode 43 and data electrode 44. As in the third modified embodiment, the data electrode 44 is insulated from the scan electrode 43 by a micromechanical leaf spring 46 which also forms a conductive bridge. At the area of the micromechanical leaf spring 46 an insulating layer 49 is provided on the scan electrode 43. The part 42 of the picture electrode 41 present below the micromechanical leaf spring 46 is provided on the insulating layer 49. FIG. 15b is a sectional view taken on the line XVb—XVb of FIG. 15a. The driving is carried out in the same manner as described with reference to FIG. 13. Upon driving the scan electrode 43 the micromechanical leaf spring 46 flips over to the part 42 of the picture electrode 41 so that a conductive connection is produced between the data electrode 44 and the picture electrode 41. An advantage of this embodiment is that a comparatively very large area of the scan electrode 43 is present below the micromechanical leaf spring 46 for forming the electric field for flipping over of the micromechanical leaf spring 46.

A fourth embodiment of a display device will be explained with reference to FIG. 16 which is a plan view of a part of a supporting plate 50. Picture electrodes 51 which are arranged in rows and columns and between which scan electrodes 52 and data electrodes 53 extend and are insulated from each other at the crossings by means of an electrically conductive bridge 54 are again provided on the supporting plate 50. The data electrodes 53 comprise parts 55 which extend towards parts 56 of the picture electrodes 51. Near each picture electrode 51 a micromechanical leaf spring 57 is provided with its fixed end 58 on the supporting plate 50. The micromechanical leaf spring 57 extends over a scan electrode 52 and the parts 55 and 56 of the data electrode 53 and the picture electrode 51, respectively. The further construction of the display device is the same as that of the display device described with reference to FIG. 11. Writing information is carried out in the same manner as described with reference to FIG. 14, but with the difference that the micromechanical leaf springs 57 do not themselves convey current. A micromechanical leaf spring 57 makes contact only between the parts 55 and 56 of a data electrode 53 and a picture electrode 51.

All the above-described embodiments relate to liquid crystal display device. However, the invention may also be applied to all electro-optical display media which have a lack of a sufficiently steep threshold and/or a lack of intrinsic memory, for example, electrophoretic suspensions and electrochromic materials.

What is claimed is:

1. A display device comprising two separated supporting plates; an electro-optical medium disposed between said supporting plates, wherein said electro-optical medium includes one of a liquid crystal, an electrophoretic suspension, or an electrochromic material; a plurality of picture electrodes formed in rows and columns on facing surfaces of said supporting plates to form a system of picture elements; a system of column electrodes disposed with said picture electrodes on one of said supporting plates; a system of row electrodes disposed below said picture electrodes on a second of said supporting plates; an insulating layer disposed between said picture electrodes and said row electrodes wherein each of said picture electrodes includes an aperture at an area over a row electrode, said row electrode being free of said insulating layer at said aperture; switching means including at least one electrostatically controllable micromechanical leaf spring being disposed in each of said apertures for providing connection between said picture electrode and said row electrode, said micromechanical leaf spring only being a metal free of any insulating layer; and an electrically conductive covering hood extending over said aperture to protect said leaf spring from said electro-optical medium.

2. A display device according to claim 1, wherein said picture electrodes and said covering hoods are reflecting.

3. A display device according to claim 1, wherein said picture electrodes and said column electrodes on said one supporting plate are integrated to strip-shaped electrodes.

4. A display device according to claim 1, wherein each of said switching means is formed by at least two of said micromechanical leaf springs, said two micromechanical leaf springs being connected in series.

5. A display device according to claim 1, wherein each of said switching means is formed by at least two of said micromechanical leaf springs, said two micromechanical leaf springs being connected in parallel.

6. A display device according to claim 1, wherein at least one of said supporting plates and said electrodes provided thereon are transparent.

7. A display device according to claim 1, wherein said electro-optical medium is a liquid crystal.

8. A display device according to claim 1, wherein said electro-optical medium is an electrophoretic suspension.

9. A display device according to claim 1, wherein said electro-optical medium is an electrochromic material.

10. A display device comprising two separated supporting plates, an electro-optical medium disposed between said supporting plates, wherein said electro-optical medium includes one of a liquid crystal, an electrophoretic suspension, or an electrochromic material; a plurality of picture electrodes formed in rows and columns on facing surfaces of said supporting plates to form a system of picture elements; a system of column electrodes disposed with said picture electrodes on one of said supporting plates, wherein said picture electrodes and said column electrodes on said one supporting plate are integrated to strip-shaped electrodes; a system of row electrodes disposed with said picture electrodes on a second of said supporting plates; and switching means including at least one electrostatically controllable micromechanical leaf spring for providing connection between said picture electrodes and said row electrodes, said micromechanical leaf spring only being a metal free of any insulating layer.

11. A display device according to claim 10, wherein each of said switching means is formed by at least two of said micromechanical leaf springs, said two micromechanical leaf springs being connected in series.

12. A display device according to claim 10, wherein each of said switching means is formed by at least two of said micromechanical leaf springs, said two micromechanical leaf springs being connected in parallel.

13. A display device according to claim 10, wherein at least one of said supporting plates and said electrodes provided thereon are transparent.

14. A display device according to claim 10, wherein said electro-optical medium is a liquid crystal.

15. A display device according to claim 10, wherein said electro-optical medium is an electrophoretic suspension.

16. A display device according to claim 10, wherein said electro-optical medium is an electrochromic material.

17. A display device comprising two separated supporting plates; an electro-optical medium disposed between said supporting plates, wherein said electro-optical medium includes one of a liquid crystal, an electrophoretic suspension, or an electrochromic material; a plurality of picture electrodes formed in rows and columns on one of said supporting plates; a common counter electrode provided on a second of said supporting plates to form a system of picture elements with said plurality; a system of row electrodes and column electrodes disposed on said one supporting plate, wherein at each crossing of row electrodes and column electrodes an electrically conductive bridge insulates a column electrode from a row electrode; and switching means including at least one electrostatically controllable micromechanical leaf spring for providing connection between said column electrode and an associated picture electrode, said micromechanical leaf spring only being a metal free of any insulating layer, and said micromechanical leaf spring extending below said bridge and extending over both said row electrode and a portion of said associated picture electrode, wherein at least one end of said micromechanical leaf spring is connected to said column electrode.

18. A display device according to claim 17, wherein said micromechanical leaf spring also forms said conductive bridge.

19. A display device according to claim 18, wherein said portion of said associated picture electrode below said micromechanical leaf spring is provided on said row electrode, and wherein an insulating layer electrically insulates said associated picture electrode from said row electrode.

20. A display device according to claim 17, wherein each of said switching means is formed by at least two of said micromechanical leaf springs, said two micromechanical leaf springs being connected in series.

21. A display device according to claim 17, wherein each of said switching means is formed by at least two of said micromechanical leaf springs, said two micromechanical leaf springs being connected in parallel.

22. A display device according to claim 17, wherein at least one of said supporting plates and said electrodes provided thereon are transparent.

23. A display device according to claim 17, wherein said electro-optical medium is a liquid crystal.

24. A display device according to claim 17, wherein said electro-optical medium is an electrophoretic suspension.

25. A display device according to claim 17, wherein said electro-optical medium is an electrochromic material.

26. A display device comprising two separated supporting plates; an electro-mechanical medium disposed between said supporting plates, wherein said electro-optical medium includes one of a liquid crystal, an electrophoretic suspension, or an electrochromic material; a plurality of picture electrodes formed in rows and columns on facing surfaces of said supporting plates to form a system of picture elements; a system of column electrodes disposed respectively between said picture electrodes on one of said supporting plates; a system of row electrodes disposed respectively between said picture electrodes on a second of said supporting plates; and switching means including at least one electrostatically controllable micromechanical leaf spring for providing connection between said picture electrodes and said row electrodes, said micromechanical leaf spring only being a metal free of any insulating layer.

27. A display device comprising two separated supporting plates; an electro-optical medium disposed between said supporting plates, wherein said electro-optical medium includes one of a liquid crystal, an electrophoretic suspension, or an electrochromic material; a plurality of picture electrodes formed in rows and columns on one of said supporting plates; a common counter electrode provided on a second of said supporting plates; a system of row electrodes and column electrodes disposed on said one supporting plate, said row electrodes and said column electrodes being interspersed with said picture electrodes, and being electrically isolated from one another; and switching means including at least one electrostatically controllable micromechanical leaf spring for providing connection between said picture electrodes and said row electrodes, said micromechanical leaf spring only being a metal free of any insulating layer.

28. A display device according to claim 27, wherein said row electrodes and said column electrodes are electrically isolated from each other at their crossings, wherein said leaf springs have fixed ends at said one supporting plate, and wherein each of said leaf springs extends over one of said row electrodes, a portion of one of said column electrodes, and a portion of an associated picture electrode.

29. A display device according to one of claims 26, 27 or 28, wherein each of said switching means is formed by at least two of said micromechanical leaf springs, said two micromechanical leaf springs being connected in series.

30. A display device according to one of claims 26, 27 or 28, wherein each of said switching means is formed by at least two of said micromechanical leaf springs, said two micromechanical leaf springs being connected in parallel.

31. A display device according to one of claims 26, 42 or 43, wherein at least one of said supporting plates and said electrodes provided thereon are transparent.

32. A display device according to one of claims 26, 27 or 28, wherein said electro-optical medium is a liquid crystal.

33. A display device according to one of claims 26, 27 or 28, wherein said electro-optical medium is an electrophoretic suspension.

34. A display device according to one of claims 26, 27 or 28, wherein said electro-optical medium is an electrochromic material.

35. A display device according to claim 16, or claim 10, or claim 17, or claim 26, or claim 27, wherein said metal of said micromechanical leaf spring is nickel.

* * * * *